(12) United States Patent
Piskun et al.

(10) Patent No.: US 12,149,189 B2
(45) Date of Patent: Nov. 19, 2024

(54) DEVICES WITH MULTIPLE ELECTRICAL CONVERTERS FOR SYNCHRONIZED ELECTRICAL CHARGE EXTRACTION

(71) Applicant: TDK Corporation, Tokyo (JP)

(72) Inventors: Vadim Piskun, San Jose, CA (US); Rakesh Sethi, San Jose, CA (US)

(73) Assignee: TDK CORPORATION, Tokyo (JP)

( * ) Notice: Subject to any disclaimer, the term of this patent is extended or adjusted under 35 U.S.C. 154(b) by 636 days.

(21) Appl. No.: 17/367,818

(22) Filed: Jul. 6, 2021

(65) Prior Publication Data

US 2023/0011704 A1    Jan. 12, 2023

(51) Int. Cl.
    *H02N 2/18*       (2006.01)
    *H02J 3/38*        (2006.01)
    *H02M 1/00*      (2006.01)
    *H02M 3/157*     (2006.01)

(52) U.S. Cl.
CPC ............ *H02N 2/181* (2013.01); *H02J 3/381* (2013.01); *H02M 1/0012* (2021.05); *H02M 3/157* (2013.01)

(58) Field of Classification Search
CPC ..... H02N 2/181; H10N 30/206; H02M 3/157; H02M 3/1582; H02M 3/33507; H02M 1/0012; H02M 1/007; H02J 3/381; H02J 1/102
See application file for complete search history.

(56) References Cited

U.S. PATENT DOCUMENTS

| | | | | |
|---|---|---|---|---|
| 6,741,436 | B2 * | 5/2004 | Gilbert | H02M 3/33515 361/18 |
| 8,680,838 | B2 * | 3/2014 | Saussele | G05F 5/00 363/125 |
| 10,050,557 | B2 * | 8/2018 | Gao | H02M 7/2176 |
| 10,217,419 | B2 * | 2/2019 | Joo | G09G 3/3406 |
| 2006/0164366 | A1 * | 7/2006 | Yu | G09G 5/18 345/98 |
| 2016/0036223 | A1 * | 2/2016 | Mishra | H02J 1/10 307/45 |
| 2017/0310227 | A1 * | 10/2017 | Zhang | H02M 3/1584 |
| 2021/0359523 | A1 * | 11/2021 | Ritchey | H02M 7/66 |
| 2022/0123656 | A1 * | 4/2022 | Wu | H02M 3/1588 |

OTHER PUBLICATIONS

Lefeuvre et al., "Piezoelectric Energy Harvesting Device Optimization by Synchronous Electric Charge Extraction," Journal of Intelligent Material Systems and Structures, 16: 865-876 (2005).

* cited by examiner

*Primary Examiner* — Emily P Pham
(74) *Attorney, Agent, or Firm* — Morgan, Lewis & Bockius LLP

(57) ABSTRACT

A method includes converting an electrical output provided by an energy generator with a first voltage converter; and, subsequent to converting the electrical output provided by the energy generator with the first voltage converter, activating, with a microprocessor, a second voltage converter for converting the electrical output provided by the energy generator with the second voltage converter. An electrical device with a microprocessor for selecting one of two or more voltage converters is also described.

19 Claims, 6 Drawing Sheets

DEVICES WITH MULTIPLE ELECTRICAL CONVERTERS FOR SYNCHRONIZED ELECTRICAL CHARGE EXTRACTION

TECHNICAL FIELD

This application relates generally to electrical converters, and more particularly to an electrical converter system for energy harvesters.

BACKGROUND

Energy harvesting, which involves deriving energy from external sources, is gaining popularity as means for powering low-energy electronics. For example, energy harvesting can be used to power wearable devices, distributed sensors, and other electronic devices. However, electrical energy provided by such energy harvesters may not be directly usable for powering such devices.

SUMMARY

The importance of energy harvesting devices has been increasing, partly due to the increased number of distributed low-power devices. For example, distributed sensor networks typically require a large number of sensors. However, many of these sensors require electrical power for operation and data transmission. In addition, frequent measurements (and transmission) of data have increased an amount of power required for such sensors. Conventional energy storage devices (e.g., lithium ion batteries) have a limited capacity and often present challenges associated with low durability, difficulty of replacement, and inferior sustainability. Such energy storage devices are typically subjected to accelerated discharge cycles, resulting in frequent or premature replacement of entire sensor modules, thereby increasing the overall cost of ownership and maintenance for the distributed sensor networks.

Energy harvesters, which typically convert non-electrical energy, such as kinetic energy, thermal energy, wind energy, or solar energy, into electrical energy, can provide electrical power to various electrical components. Energy-harvesting devices (e.g., an electrical power generator that converts kinetic and mechanical energy, such as rotation, acceleration, deceleration, compression, tension, and/or vibration of various mechanical structures into electrical energy) may replace conventional energy storage devices or, when used in conjunction, prolong the life expectancy of such energy storage devices.

However, the output from such energy-harvesting devices may not be suitable for direct use by electronic devices. For example, a voltage of an electrical output from such energy-harvesting devices may be too high or too low compared to a voltage required by a particular electronic device. In addition, the voltage (or other characteristics) of the electrical output from such energy-harvesting devices may change depending on changes in the environment. Thus, there is a need for methods and devices that can intelligently convert an electrical output from an energy-harvesting device for use by electronic devices.

The devices and methods described herein address challenges associated with conventional devices and methods for converting an electrical output from an energy-harvesting device by utilizing two or more electrical converters, including an electrical converter that synchronously converts an electrical output, and a microprocessor that conditionally activates the two or more electrical converters. The disclosed devices may replace conventional electrical converters.

In accordance with some embodiments, a method includes converting an electrical output provided by an energy generator with a first voltage converter; and, subsequent to converting the electrical output provided by the energy generator with the first voltage converter, activating, with a microprocessor, a second voltage converter for synchronously converting the electrical output provided by the energy generator with the second voltage converter.

In accordance with some embodiments, an electrical device includes a first voltage converter; a second voltage converter that is distinct and separate from the first voltage converter; and a microprocessor coupled with the first voltage converter and the second voltage converter for selecting one of the first voltage converter or the second voltage converter for converting an electrical output provided by an energy generator.

BRIEF DESCRIPTION OF THE DRAWINGS

The disclosed devices and methods allow electrical connection between an energy-harvesting device and other electrical components located inside a tire and/or a wheel.

For a better understanding of the various described embodiments, reference should be made to the Description of Embodiments below, in conjunction with the following drawings in which like reference numerals refer to corresponding parts throughout the figures.

DESCRIPTION OF EMBODIMENTS

Figure 1:
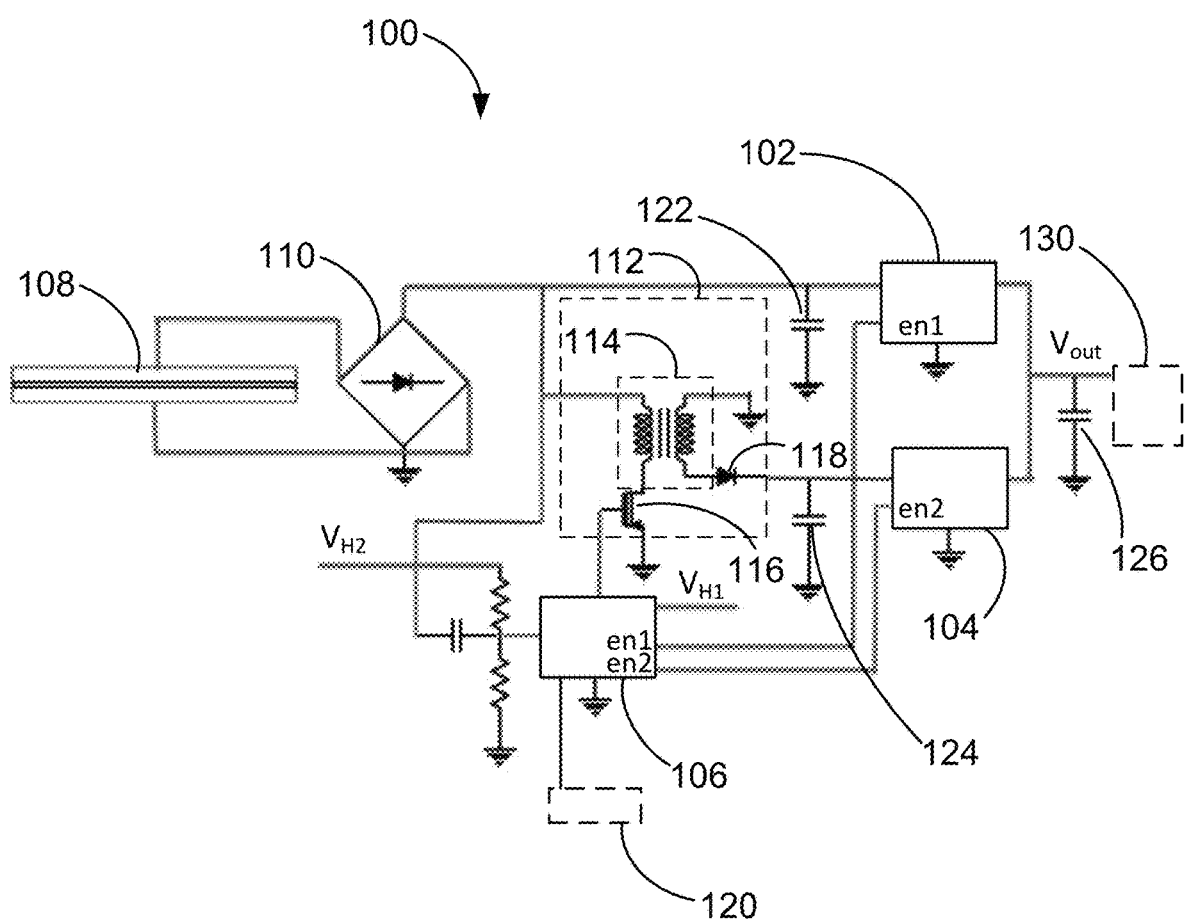
FIG. 1 is a schematic diagram illustrating an electrical device in accordance with some embodiments.

Reference will be made to embodiments, examples of which are illustrated in the accompanying drawings. In the following description, numerous specific details are set forth in order to provide a thorough understanding of the various described embodiments. However, it will be apparent to one of ordinary skill in the art that the various described embodiments may be practiced without these particular details. In other instances, methods, procedures, components, circuits, and networks that are well-known to those of ordinary skill in the art are not described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first voltage converter could be termed a second voltage converter, and, similarly, a second voltage converter could be termed a first voltage converter, without departing from the scope of the various described embodiments. The first voltage converter and the second voltage converter are both voltage converters, but they are not the same voltage converter.

The terminology used in the description of the embodiments herein is for the purpose of describing particular embodiments only and is not intended to be limiting of the scope of claims. As used in the description and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As explained above, energy harvesting devices (also called herein energy harvester, energy generating device, or energy generator) are gaining popularity as means for providing electrical power to various electrical components. For example, piezoelectric energy harvesters are used to convert kinetic energy (e.g., vibration, rotation, acceleration, deceleration, compression, and/or tension of various mechanical structures) into electrical energy. However, electrical outputs from such energy harvesters (e.g., piezoelectric energy harvesters) are not constant. For example, due to the vibration of a mechanical structure (e.g., a cantilever), the electrical output (e.g., electrical power) from such energy harvesters is nonlinear (e.g., sinusoidal). Furthermore, an electromechanical coupling between the energy harvesting device and the load can reduce the efficiency of energy harvesting.

Synchronous electric charge extraction, which includes activation of an electrical converter in a non-continuous manner (e.g., in short intervals), can improve the efficiency of energy harvesting. For example, activating the electrical converter based on a frequency (e.g., a resonance frequency) of the cantilever in the piezoelectric energy harvester may reduce the efficiency of energy harvesting by up to 400% (e.g., activating the electrical converter at time points adjacent to when a mechanical displacement (or a mechanical distortion) of the cantilever is maximum or minimum)).

However, such non-continuous (e.g., discrete) activation of the electrical converter typically requires a controller (e.g., a microprocessor), and in typical environments where the energy harvester is to be used (e.g., in distributed sensor networks or wearable devices), energy source that can sufficiently power the controller may not be readily available. Such challenges are addressed by the electrical device shown in FIG. 1.

FIG. 1 is a schematic diagram illustrating the electrical device 100 in accordance with some embodiments. The electrical device 100 includes a first voltage converter 102 and a second voltage converter 104. In some embodiments, at least one of the first voltage converter 102 or the second voltage converter 104 is a direct-current to direct-current (DC-DC) converter. In some embodiments, In some embodiments, both the first voltage converter 102 and the second voltage converter 104 are DC-DC converters.

The electrical device 100 also includes one or more microprocessors (e.g., microprocessor 106) for controlling activation of the first voltage converter 102 and activation of the second voltage converter 104. For example, in some embodiments, as shown in FIG. 1, the microprocessor 106 provides enable signals (e.g., en1 for deactivating the first voltage converter 102 and en2 for activating the second voltage converter 104). In some embodiments, the first voltage converter 102 is activated while en1 signal is not provided (or en1 is set to low) and deactivated while en1 signal is provided (or en1 is set to high). In some embodiments, the second voltage converter 104 is activated while en2 signal is provided (or en1 is set to high) and deactivated while en2 signal is not provided (or en2 is set to low).

In some embodiments, the electrical device 100 includes one or more sensors 120 that are electrically coupled to the microprocessor 106. In some embodiments, the microprocessor 106 determines whether to activate the first voltage converter 102 or the second voltage converter 104 (or both or none) based at least on signals from the one or more sensors 120. In some embodiments, the microprocessor 106 determines whether to activate the first voltage converter 102 or the second voltage converter 104 (or both or none) based on the electrical output from an energy generator 108 (received directly from the energy generator 108 or indirectly through one or more components, such as a rectifier 110).

In some embodiments, the electrical device 100 is coupled to, or includes, the energy generator 108 (e.g., an energy harvester, such as a piezoelectric energy harvester). The energy generator 108 provides electrical output by converting ambient energy, such as kinetic energy, into electrical energy.

In some embodiments, the electrical device 100 includes the rectifier 110 for rectifying the electrical output from the energy generator 108. In some embodiments, the rectifier 110 includes a half-wave rectifier or a full-wave rectifier. In some embodiments, the rectifier 110 includes a diode bridge (also called a bridge rectifier) (e.g., four or more diodes in a bridge circuit configuration).

In some embodiments, the electrical device 100 includes a voltage converter 112. In some embodiments, an electrical output from the rectifier 110 is coupled in parallel to the first voltage converter 102 and the voltage converter 112 so that the first voltage converter 102 receives the electrical output provided by the energy generator 108 (and processed by the rectifier 110) without going through the voltage converter 112 whereas the second voltage converter 104 receives the electrical output provided by the energy generator 108 (and processed by the rectifier 110) through the voltage converter 112.

In some embodiments, the voltage converter 112 includes a flyback converter. In some embodiments, the voltage converter 112 includes a buck-boost converter. In some embodiments, the voltage converter 112 includes an energy storage device 114 (e.g., an inductor). For example, the buck-boost converter includes an inductor. In another example, the flyback converter includes an inductor that is part of a transformer. In some embodiments, an electrical output from the rectifier 110 is coupled in parallel to the first voltage converter 102 and the energy storage device 114 so that the first voltage converter 102 receives the electrical output provided by the energy generator 108 (and processed by the rectifier 110) without going through the energy storage device 114 whereas the second voltage converter 104 receives the electrical output provided by the energy generator 108 (and processed by the rectifier 110) through the energy storage device 114.

In some embodiments, the flyback converter includes a switch 116 (e.g., a transistor) electrically coupled to the energy storage device 114 to activate the flyback converter. The microprocessor 106 is electrically coupled to the switch 116 for activating or deactivating the switch 116 (e.g., the microprocessor 106 provides a non-zero gate voltage to the transistor of the switch 116 for activating the switch 116 and foregoes providing the gate voltage (or setting the gate voltage below a threshold) to the transistor of the switch 116 for deactivating the switch 116). In some embodiments, the microprocessor 106 is electrically coupled to an electrical output of the rectifier 110 (or the energy generator 108). In some embodiments, the microprocessor 106 is electrically coupled to the electrical output of the rectifier 110 (or the energy generator 108) directly. In some embodiments, the microprocessor 106 is electrically coupled to an electrical output of the rectifier 110 (or the energy generator 108) indirectly (e.g., through one or more components, such as a capacitor and a voltage divider as shown in FIG. 1). The microprocessor 106 monitors the electrical output of the rectifier 110 (or the energy generator 108) for determining a timing of activating the switch 116 (e.g., activating the switch 116 when the displacement or bending of a cantilever in the energy generator 108 is near maximum or near minimum).

In some embodiments, the flyback converter includes one or more diodes 118 electrically coupled to the energy storage device 114. The one or more diodes 118 facilitate providing the electrical output to the second voltage converter 104 in a single direction.

In some embodiments, the electrical device 100 also includes one or more capacitors, which facilitates smoothing a provided current. In some embodiments, the electrical device 100 includes a first capacitor 122 for smoothing a current provided to the first voltage converter 102, a second capacitor 124 for smoothing a current provided to the second voltage converter 104, or both. In some embodiments, the electrical device 100 includes a third capacitor 126 for smoothing an output current (or an output voltage, Vout) of the electrical device 100. In some embodiments, the electrical device 100 does not include a capacitor between the rectifier 110 and the voltage converter 112, as such capacitor may interfere with, or reduce efficiency of, synchronous electrical charge extraction performed by the voltage converter 112 with the second voltage converter 104.

In some embodiments, the output voltage Vout from the electrical device 100 is electrically connected to the microprocessor 106 (e.g., to the $V_{H1}$ lines coupled to the microprocessor 106) for powering the microprocessor 106. In some embodiments, the output voltage Vout from the electrical device 100 is electrically connected to a second electrical device 130 (e.g., a distributed sensor, a wearable device, etc.). In some embodiments, the output voltage Vout from the electrical device 100 is electrically connected to both the microprocessor 106 and the second electrical device 130.

Figure 2:
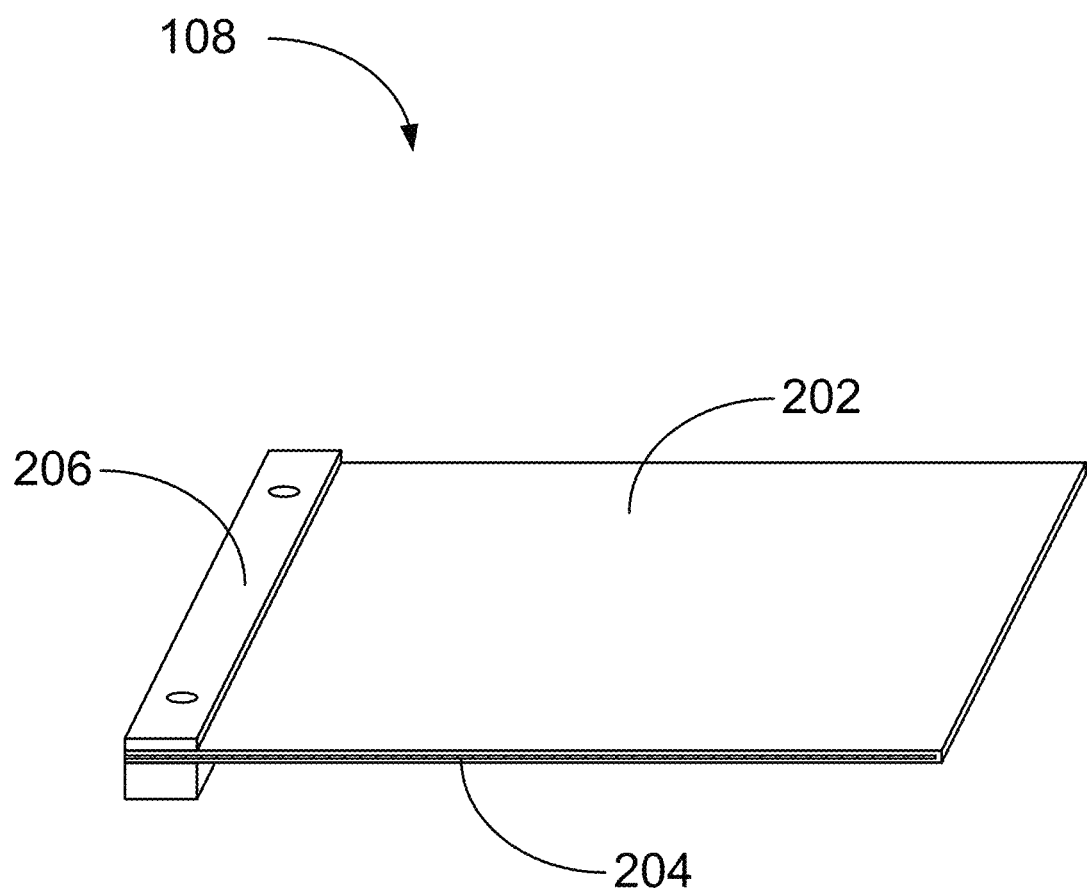
FIG. 2 is a schematic diagram illustrating an energy generator in accordance with some embodiments.

FIG. 2 is a schematic diagram illustrating the energy generator 108 (also called an energy harvester) in accordance with some embodiments. In FIG. 2, the energy generator 108 includes a cantilever 202. In some embodiments, the cantilever 202 is a projecting beam supported by one end. In some embodiments, the cantilever 202 has a uniform width and a uniform thickness along its length, as shown in FIG. 2. In some embodiments, the cantilever 202 has (1) a non-uniform width along its length while its thickness remains uniform along its length, (2) a non-uniform thickness along its length while its width remains uniform along its length, or (3) a non-uniform width and a non-uniform thickness along its length.

In some embodiments, the cantilever 202 includes a piezoelectric material 204. Examples of piezoelectric materials include gallium nitride, indium nitride, aluminum nitride, zinc oxide, barium titanate, lead zirconate titanate, potassium niobate, sodium tungstate, $Ba_2NaNb_5O_5$, $Pb_2KNb_5O_5$, single crystalline zinc oxide, langasite, gallium orthophosphate, lithium niobate, lithium tantalite, sodium potassium niobate, bismuth ferrite, sodium niobate, bismuth titanate, sodium bismuth titanate, quartz, berlinite, topaz, lead titanate, and piezoelectric polymers, such as polyvinylidene fluoride, polyamides, paralyne-C, polyimide, and polyvinylidene chloride. Piezoelectric materials are capable of generating electrical charge in response to applied mechanical stress. Thus, when the cantilever 202 bends, the piezoelectric material provides charges that are indicative of the amplitude of how much the cantilever 202 is bent (e.g., a displacement of a free end of the cantilever 202). Similarly, when the cantilever 202 vibrates, the piezoelectric material in the cantilever 202 provides an (oscillating) electrical signal that corresponds to the vibration of the cantilever 202.

The length, width, and thickness of the cantilever 202 are selected to obtain a desired performance of the energy generator 108. In some embodiments, the length is between 1 cm and 30 cm, between 1 cm and 10 cm, between 5 cm and 15 cm, between 10 cm and 20 cm, between 15 cm and 25 cm, between 20 cm and 30 cm, between 1 cm and 5 cm, between 5 cm and 10 cm, between 10 cm and 15 cm, between 15 cm and 20 cm, between 20 cm and 25 cm, between 25 cm and 30 cm, between 1 cm and 3 cm, between 2 cm and 4 cm, between 3 cm and 5 cm, between 4 cm and 6 cm, between 5 cm and 7 cm, between 6 cm and 8 cm, between 7 cm and 9 cm, or between 8 cm and 10 cm. In some embodiments, the length is approximately 1 cm, approximately 2 cm, approximately 3 cm, approximately 4 cm, approximately 5 cm, approximately 6 cm, approximately 7 cm, approximately 8 cm, approximately 9 cm, approximately 10 cm, approximately 15 cm, approximately 20 cm, approximately 25 cm, or approximately 30 cm. In some embodiments, the width is between 1 cm and 10 cm, between 5 cm and 15 cm, between 10 cm and 20 cm, between 1 cm and 5 cm, between 5 cm and 10 cm, between 10 cm and 15 cm, between 15 cm and 20 cm, between 1 cm and 4 cm, between 2 cm and 5 cm, between 3 cm and 6 cm, between 4 cm and 7 cm, between 5 cm and 8 cm, between 6 cm and 9 cm, or between 7 cm and 10 cm. In some embodiments, the width is approximately 1 cm, approximately 2 cm, approximately 3 cm, approximately 4 cm, approximately 5 cm, approximately 6 cm, approximately 7 cm, approximately 8 cm, approximately 9 cm, approximately 10 cm, approximately 15 cm, or approximately 20 cm. In some embodiments, the thickness of the cantilever 202 is between 100 μm and 5 mm, between 100 μm and 3 mm, between 1 mm and 4 mm, between 2 mm and 5 mm, between 100 μm and 1 mm, between 500 μm and 1.5 mm, between 1 mm and 2 mm, between 1.5 mm and 2.5 mm, between 2 mm and 3 mm, between 2.5 mm and 3.5 mm, between 3 mm and 4 mm, between 3.5 mm and 4.5 mm, between 4 mm and 5 mm, between 100 μm and 500 μm, between 500 μm and 1 mm, between 1 mm and 1.5 mm, between 1.5 mm and 2 mm, between 2 mm and 2.5 mm, or between 2.5 mm and 3 mm. In some embodiments, the thickness of the cantilever 202 is approximately 100 μm, approximately 200 μm, approximately 300 μm, approximately 400 μm, approximately 500 μm, approximately 600 μm, approximately 1 mm, approximately 2 mm, approximately 3 mm, approximately 4 mm, or approximately 5 mm. In some embodiments, the thickness of a layer of the piezoelectric material in the cantilever 202 is between 10 μm and 1 mm, between 100 μm and 500 μm, between 200 μm and 600 µm, between 300 µm and 700 µm, between 400 µm and 800 µm, between 500 µm and 900 µm, between 600 µm and 1 mm, between 50 µm and 150 µm, between 100 µm and 200 µm, between 150 µm and 250 µm, between 200 µm and 300 µm, between 250 µm and 350 µm, between 300 µm and 400 µm, between 350 µm and 450 µm, between 400 µm and 500 µm, between 500 µm and 600 µm, between 600 µm and 700 µm, between 700 µm and 800 µm, or between 800 µm and 900 µm. In some embodiments, the thickness of the layer of the piezoelectric material in the cantilever 202 is approximately 100 µm, approximately 200 µm, approximately 300 µm, approximately 400 µm, approximately 500 µm, approximately 600 µm, approximately 700 µm, approximately 800 µm, approximately 900 µm, approximately 1 mm, approximately 2 mm, approximately 3 mm, approximately 4 mm, or approximately 5 mm.

In some embodiments, the cantilever 202 includes a single layer of piezoelectric material. In some embodiments, the cantilever 202 includes two or more layers of piezoelectric material. In some embodiments, the two or more layers of piezoelectric material are separated by one or more interleaving layers of an insulating material or a conductive material.

FIG. 2 also shows a clamp 206 that is configured to support and immobilize one end of the cantilever 202. In FIG. 2, the clamp 206 has a shape of a plate. However, a clamp having any other shape may be used. Although FIG. 2 shows that the clamp 206 is located at the tip of the cantilever 202, the clamp 206 does not need to be aligned with a tip of the cantilever 202. For example, the clamp 206 may be positioned offset from the tip of the cantilever 202 (e.g., by 1 mm, 2 mm, 3 mm, 4 mm, 5 mm, 7 mm, 10 mm, 15 mm, 20 mm, 25 mm, etc.) so that there is an overhang when the clamp 206 is positioned on the cantilever 202. In some embodiments, the cantilever 202 extends in a single direction from the clamp 206. In some embodiments, the cantilever 202 extends in multiple directions (e.g., in two opposite directions) from the clamp 206.

In some embodiments, the clamp 206 and/or the cantilever 202 have one or more through-holes for securing the cantilever 202 and the clamp to a base. For example, screws may be placed through corresponding through-holes for immobilizing the clamp 206 and the cantilever 202. Alternatively, other mechanisms may be used for immobilizing the cantilever 202. For example, the clamp 206 and the cantilever 202 may have slits through which a clip is inserted to immobilize the clamp 206 and the cantilever 202. In another example, the cantilever 202 may be integrated with its base, in which case the clamp 206 is omitted.

Figure 3:
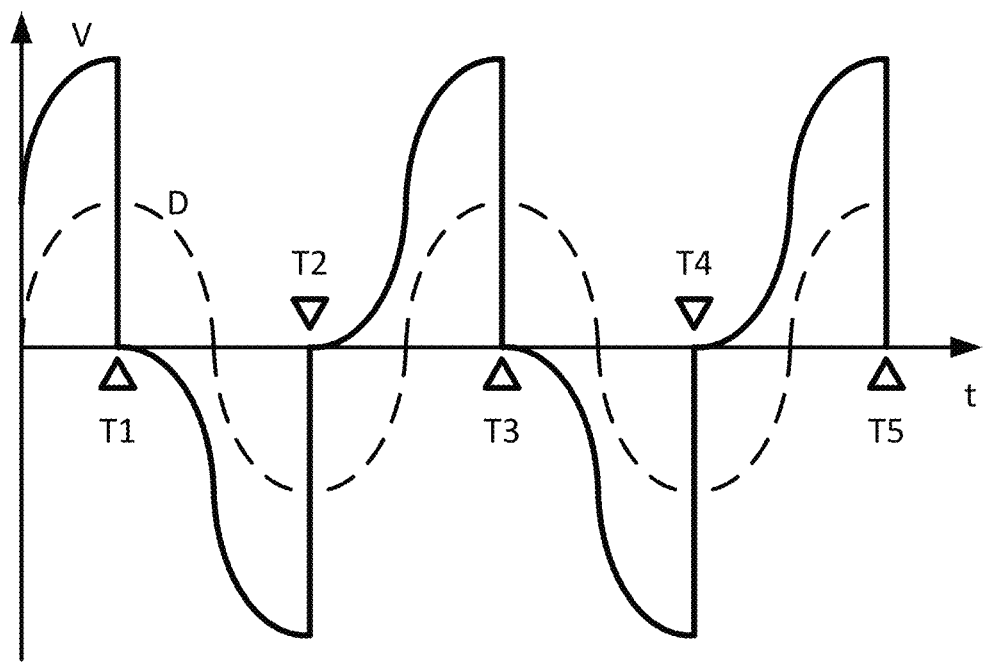
FIG. 3 is a timing diagram illustrating timing of activating a switch of the electrical device in accordance with some embodiments.

FIG. 3 is a timing diagram illustrating timing of activating the switch 116 in relation to the displacement D in the energy generator (e.g., a displacement or bending of a cantilever in the piezoelectric energy harvesting device, such as the cantilever 202 shown in FIG. 2) and the voltage V provided by the energy generator in accordance with some embodiments.

By activating the switch 116 at times near when the displacement D is maximum or minimum (e.g., exactly when the displacement D is maximum or minimum, or when the displacement D deviates from the maximum or minimum displacement by less than 1%, 5%, 10%, 15%, or 20%), the efficiency of extracting electrical power from the energy generator can be increased.

Although FIG. 3 is used to describe activation of the switch 116 in response to a sinusoidal displacement in the energy generator, the switch 116 may be activated for non-sinusoidal displacements in the energy generator (e.g., at a displacement above a certain threshold). Thus, the electrical device 100 described with respect to FIG. 1 may be used for conditions under which the energy generator provides non-sinusoidal electrical signals.

Figure 4:
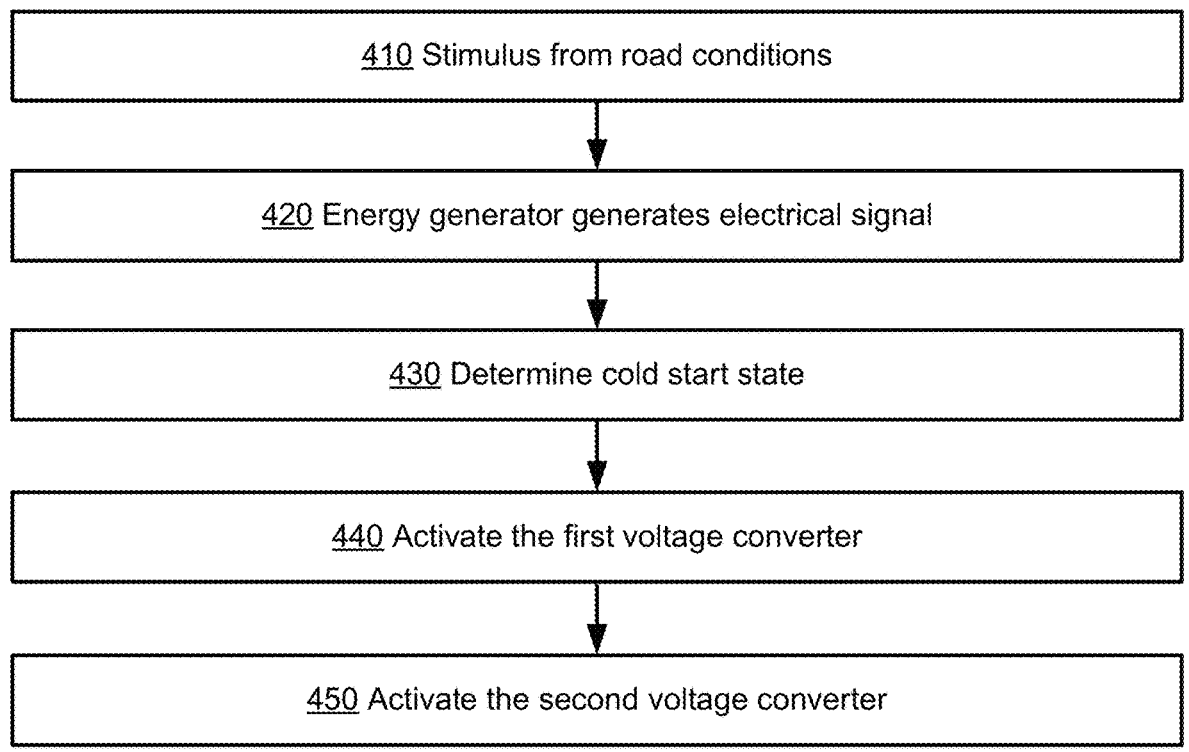
FIG. 4 illustrates a sequence in converting an electrical output from an energy generation device in accordance with some embodiments.

FIG. 4 illustrates a sequence in converting an electrical output from an energy generation device in accordance with some embodiments.

In configurations in which the electrical device 100 and the energy generation device are mounted on a road vehicle (e.g., an automobile, a bicycle, etc.), as the road vehicle drives on a road, the road vehicle is subject to stimulus from road conditions (410) (e.g., vibrations from the road vehicle driving on the road). In some embodiments, the road vehicle is also subject to vibrations caused by components of the road vehicle (e.g., engine, transmission, motors, etc.).

Such stimulus from road conditions are delivered to the energy generation device, which generates electrical signal (420). While the road vehicle is in a cold start state, the electrical signal is typically non-sinusoidal.

Subsequently, whether the road vehicle (or the electrical device) is in the cold start state is determined (430). In some embodiments, a state machine comparator, implemented using a microprocessor, determines whether the road vehicle (or the electrical device) is in a cold start state. In some embodiments, a voltage profile, of an electrical output from the energy generation device, having a non-sinusoidal wave or a voltage below a certain voltage threshold indicates that the road vehicle (or the electrical device) is in the cold start state.

While the road vehicle (or the electrical device) is in the cold start state, a first voltage converter (e.g., an electrical converter configured to continuous charge extraction) is activated (440). Additionally or alternatively, the first voltage converter may be activated for premature cycles of an engine of the road vehicle or deceleration of the road vehicle, which may cause the vibration frequency of the cantilever in the energy generation device.

While the road vehicle (or the electrical device) is in a steady state (e.g., the vibration frequency of the cantilever in the energy generation device remains within a predefined range), a second voltage converter (e.g., an electrical converter configured for synchronous electrical charge extraction) is activated.

Figure 5:
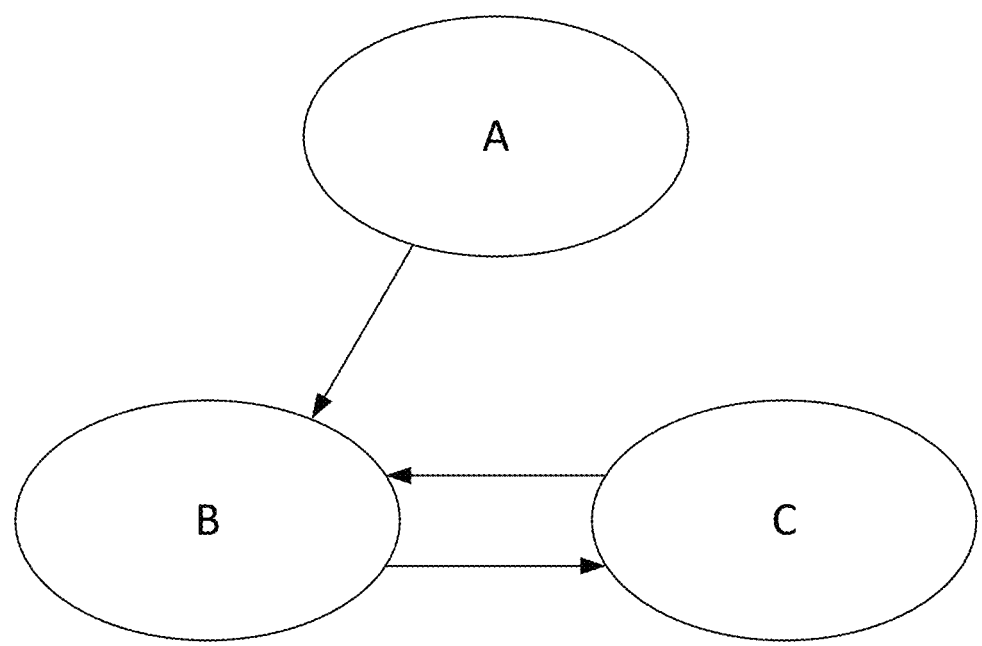
FIG. 5 illustrates a state diagram in accordance with some embodiments.

FIG. 5 illustrates a state diagram in accordance with some embodiments.

In FIG. 5, state A represents a cold start state, which correspond to step 410 and 420 shown in FIG. 4. State B corresponds to a state in which the first voltage converter is activated, corresponding to step 440 shown in FIG. 4. State C corresponds to a state in which the second voltage converter is activated, corresponding to step 450 shown in FIG. 4. As shown in FIG. 4, if the road vehicle (or the electrical device) reaches a steady state (after the road vehicle or the electrical device is in State B), the electrical device switches from State B to State C. In some cases, if the road vehicle (or the electrical device) moves out of the steady state (after the road vehicle or the electrical device is in State C, due to the vehicle's deceleration or any other conditions), the electrical device switches from State C back to State B. In some configurations, the electrical device may switch between State B and State C as the road vehicle or the electrical device moves into and out of the steady state.

Although FIGS. 4 and 5 are described with respect to a road vehicle, the principles and examples described above may apply to other types of vehicles (e.g., aerial vehicles, maritime vehicles, aerospace vehicles, etc.), and non-vehicle devices or systems (e.g., machinery, equipment, mechanical tools, mechanical structures, buildings, etc.).

Figure 6:
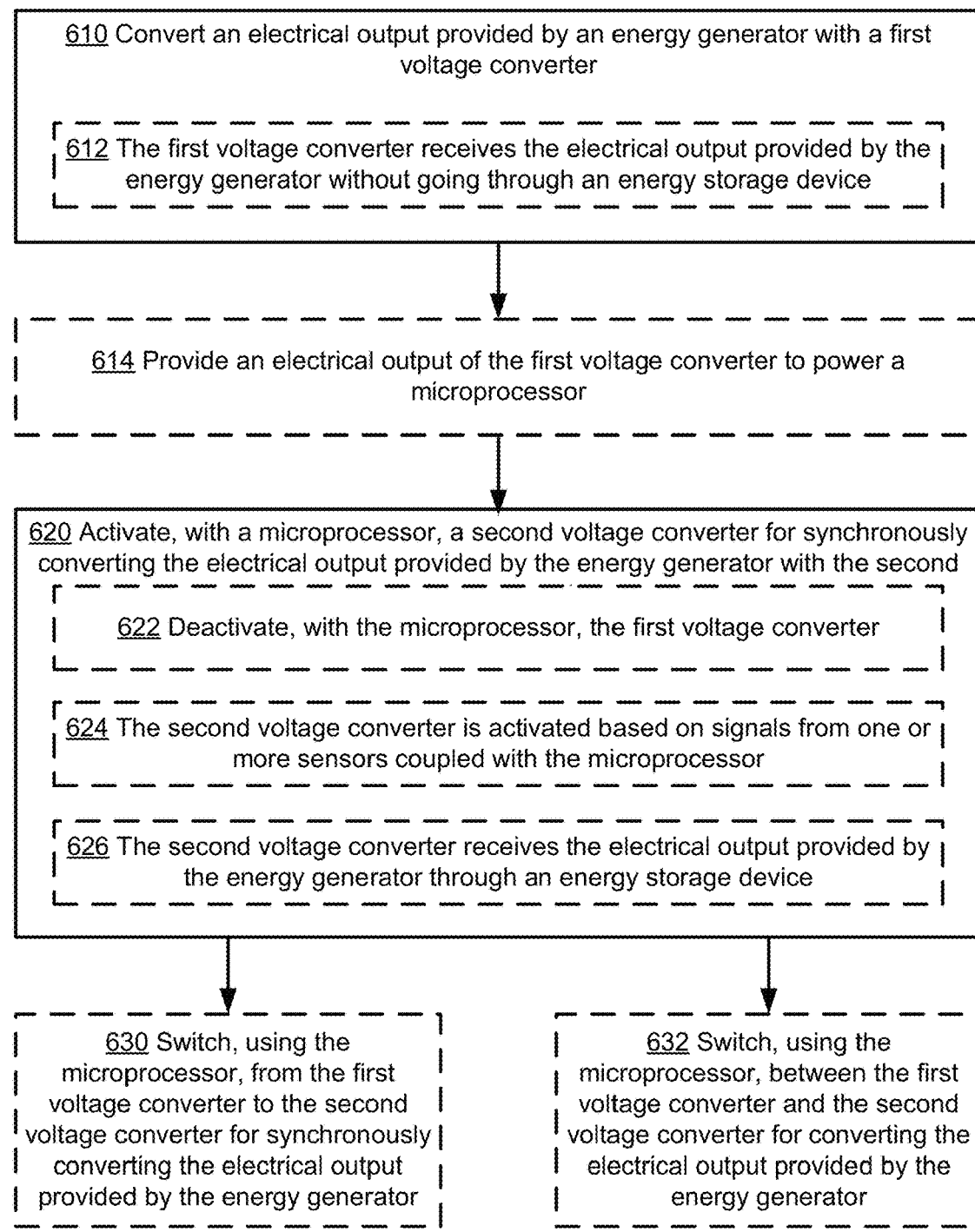
FIG. 6 is a flow diagram illustrating a method of converting an electrical output from an energy generation device in accordance with some embodiments.

FIG. 6 is a flow diagram illustrating a method 600 of converting an electrical output from an energy generation device in accordance with some embodiments. In some embodiments, the method 600 is performed by the electrical device 100 described with respect to FIG. 1.

The method 600 includes (610) converting an electrical output provided by an energy generator (e.g., 108) with a first voltage converter (e.g., 102).

In some embodiments, the first voltage converter (612) receives the electrical output provided by the energy generator (e.g., 108) without going through an energy storage device (e.g., 114). In some embodiments, the first voltage converter (612) receives the electrical output provided by the energy generator (e.g., 108) without going through a voltage converter 112 (e.g., a buck-boost converter or flyback converter). For example, as shown in FIG. 1, the first voltage converter (e.g., 102) may be connected directly to the rectifier 110.

In some embodiments, the method 600 includes, prior to activating the second voltage converter, (614) providing an electrical output of the first voltage converter to power the microprocessor (e.g., Vout from the first voltage converter 102 may be connected to $V_{H1}$ for powering the microprocessor 106).

The method 600 also includes, subsequent to converting the electrical output provided by the energy generator with the first voltage converter, (620) activating, with a microprocessor (e.g., 106), a second voltage converter (e.g., 104) for synchronously converting the electrical output provided by the energy generator (e.g., 108) with the second voltage converter (e.g., 104). For example, the microprocessor 106 sets (or sends) the en2 signal to activate the second voltage converter 104. In some embodiments, the microprocessor, subsequent to activating the second voltage converter, turns on and off the switch of the voltage converter 112 (e.g., the switch 116) for synchronous electrical charge extraction from the energy generator. In some embodiments, while the second voltage converter is activated, the microprocessor turns on and off the switch of the voltage converter (e.g., the switch 116) for synchronous electrical charge extraction from the energy generator.

In some embodiments, the method 600 includes (622) deactivating, with the microprocessor (e.g., 106), the first voltage converter (e.g., 102) in connection with activating the second voltage converter (e.g., 104). For example, the microprocessor 106 may set (or send) the en1 signal to deactivate the first voltage converter 102 concurrently with, or adjacently to, activating the second voltage converter 104.

In some embodiments, the second voltage converter is activated based on signals from the electrical output from the energy generator (which may have been processed by one or more components, such as the rectifier 110). For example, the microprocessor 106 may activate the second voltage converter 104 in accordance with a determination that the electrical output from the energy generator is sinusoidal, or substantially sinusoidal (e.g., the frequency of the electrical output is in a steady state). In some embodiments, a state machine comparator (e.g., implemented using the microprocessor 106) determines whether the electrical device 100 (or the energy generator 108) is in a cold start state, and the microprocessor activates the second voltage converter in accordance with a determination that the electrical device 100 (or the energy generator 108) is not in the cold start state.

In some embodiments, the second voltage converter is activated (624) based on signals from one or more sensors (e.g., 120) coupled with the microprocessor. In some embodiments, the one or more sensors include sensors for sending information indicating road conditions and/or sending changes in environmental, mechanical, or electromagnetic energy sources. In some embodiments, the energy generator also serves as a sensor (e.g., the electrical output from the energy generator with a piezoelectric cantilever indicates the road condition).

In some embodiments, the second voltage converter (626) receives the electrical output provided by the energy generator through an energy storage device (e.g., the second voltage converter 104 is electrically coupled to the energy generator 108 through the energy storage device 114 of the voltage converter 112).

In some embodiments, the method 600 includes, subsequent to activating the second voltage converter, (630) switching, using the microprocessor, from the second voltage converter to the first voltage converter for converting the electrical output provided by the energy generator (e.g., the microprocessor 106 activates the first voltage converter 102 and deactivates the second voltage converter 104 in accordance with a determination that the electrical output from the energy generator 108 has ceased to be sinusoidal).

In some embodiments, the method 600 includes, subsequent to activating the second voltage converter, (632) switching, using the microprocessor, between the first voltage converter and the second voltage converter for converting the electrical output provided by the energy generator. This allows utilizing the high efficiency of the second voltage converter 104 coupled with the voltage converter 112 when the electrical output is sinusoidal and utilizing a low power operation of the first voltage converter 102 when the electrical output is non-sinusoidal or noisy.

In light of these examples and principles explained herein, we now turn to certain embodiments.

In accordance with some embodiments, an electrical device (e.g., 100) includes a first voltage converter (e.g., 102); a second voltage converter (e.g., 104) that is distinct and separate from the first voltage converter; and a microprocessor (e.g., 106) coupled with the first voltage converter and the second voltage converter for selecting one of the first voltage converter or the second voltage converter for converting an electrical output provided by an energy generator.

In some embodiments, the electrical device includes an energy storage device (e.g., 114) electrically coupled to the energy generator (e.g., 108) to receive the electrical output provided by the energy generator. In some embodiments, as shown in FIG. 1, the energy storage device 114 is electrically coupled to the energy generator 108 through one or more electrical components (e.g., the rectifier 110).

In some embodiments, the second voltage converter (e.g., 104) is electrically coupled to an output of the energy storage device (e.g., 114) to receive an electrical output of the energy storage device (e.g., 114).

In some embodiments, the first voltage converter (e.g., 102) is not electrically coupled to an output of the energy storage device (e.g., 114) so that the first voltage converter (e.g., 102) does not receive the electrical output of the energy storage device (e.g., 114).

In some embodiments, the energy storage device includes a transformer (e.g., the transformer as shown in FIG. 1).

In some embodiments, the electrical device (e.g., 100) includes a switch (e.g., 116) electrically coupled to the energy storage device (e.g., 114). The switch (e.g., 116) is electrically coupled to the microprocessor (e.g., 106) so that the microprocessor (e.g., 106) opens or closes the switch (e.g., 116).

In some embodiments, the first voltage converter (e.g., 102) includes a first direct current to direct current (DC-DC) converter; and the second voltage converter (e.g., 104) includes a second direct current to direct current (DC-DC) converter. The second DC-DC converter is distinct from the first DC-DC converter.

In some embodiments, the microprocessor (e.g., 106) is electrically coupled to the energy generator (e.g., 108) for monitoring the electrical output of the energy generator (e.g., 108) and selecting one of the first voltage converter (e.g., 102) or the second voltage converter (e.g., 104) based at least in part on the electrical output of the energy generator (e.g., 108). For example, as shown in FIG. 1, the microprocessor 106 is electrically coupled to the energy generator 108 through the rectifier 110 so that the microprocessor 106 monitors the electrical output from the energy generator 108.

In some embodiments, the electrical device (e.g., 100) includes one or more sensors (e.g., 120) electrically coupled to the microprocessor (e.g., 106) so that the microprocessor (e.g., 106) selects one of the first voltage converter (e.g., 102) or the second voltage converter (e.g., 104) based at least in part on signals from the one or more sensors (e.g., 120).

In some embodiments, the electrical device includes the energy generator (e.g., 108). In some embodiments, the electrical device is configured for electrically coupling with the energy generator, but does not include the energy generator.

In some embodiments, the energy generator (e.g., 108) includes a piezoelectric element (e.g., 204) configured to convert a mechanical force on the piezoelectric element to an electrical output.

In some embodiments, the electrical device (e.g., 100) includes a rectifier (e.g., 110) electrically coupled to the energy generator (e.g., 108).

Some embodiments may be described with respect to the following clauses:

Clause 1. A method, comprising:
converting an electrical output provided by an energy generator with a first voltage converter; and
subsequent to converting the electrical output provided by the energy generator with the first voltage converter, activating, with a microprocessor, a second voltage converter for synchronously converting the electrical output provided by the energy generator with the second voltage converter.

Clause 2. The method of clause 1, wherein the second voltage converter is activated when an electrical output from the first voltage converter is above a predefined threshold.

Clause 3. The method of clause 1 or 2, wherein the second voltage converter is activated based on signals from one or more sensors coupled with the microprocessor.

Clause 4. The method of any of clauses 1-3, including:
deactivating, with the microprocessor, the first voltage converter in connection with activating the second voltage converter.

Clause 5. The method of any of clauses 1-4, including:
prior to activating the second voltage converter, providing an electrical output of the first voltage converter to power the microprocessor.

Clause 6. The method of any of clauses 1-5, further comprising:
subsequent to activating the second voltage converter, switching, using the microprocessor, from the second voltage converter to the first voltage converter for converting the electrical output provided by the energy generator.

Clause 7. The method of any of clauses 1-6, further comprising:
subsequent to activating the second voltage converter, switching, using the microprocessor, between the first voltage converter and the second voltage converter for converting the electrical output provided by the energy generator.

Clause 8. The method of any of clauses 1-7, wherein:
the second voltage converter receives the electrical output provided by the energy generator through an energy storage device.

Clause 9. The method of any of clauses 1-8, wherein:
the first voltage converter receives the electrical output provided by the energy generator without going through an energy storage device.

Clause 10. An electrical device, comprising:
a first voltage converter;
a second voltage converter that is distinct and separate from the first voltage converter; and
a microprocessor coupled with the first voltage converter and the second voltage converter for selecting one of the first voltage converter or the second voltage converter for synchronously converting an electrical output provided by an energy generator.

Clause 11. The electrical device of clause 10, further comprising:
an energy storage device electrically coupled to the energy generator to receive the electrical output provided by the energy generator.

Clause 12. The electrical device of clause 11, wherein:
the second voltage converter is electrically coupled to an output of the energy storage device to receive an electrical output of the energy storage device.

Clause 13. The electrical device of clause 11 or 12, wherein:
the first voltage converter is not electrically coupled to an output of the energy storage device so that the first voltage converter does not receive the electrical output of the energy storage device.

Clause 14. The electrical device of any of clauses 11-13, wherein:
the energy storage device includes a transformer.

Clause 15. The electrical device of any of clauses 11-14, further comprising:
a switch electrically coupled to the energy storage device, wherein the switch is electrically coupled to the microprocessor so that the microprocessor opens or closes the switch.

Clause 16. The electrical device of any of clauses 10-15, wherein:
the first voltage converter includes a first direct current to direct current (DC-DC) converter; and
the second voltage converter includes a second direct current to direct current (DC-DC) converter.

Clause 17. The electrical device of any of clauses 10-16, wherein:
the microprocessor is electrically coupled to the energy generator for monitoring the electrical output of the energy generator and selecting one of the first voltage converter or the second voltage converter based at least in part on the electrical output of the energy generator.

Clause 18. The electrical device of any of clauses 10-17, further comprising:
one or more sensors electrically coupled to the microprocessor so that the microprocessor selects one of the first voltage converter or the second voltage converter based at least in part on signals from the one or more sensors.

Clause 19. The electrical device of any of clauses 10-18, further comprising: the energy generator.

Clause 20. The electrical device of any of clauses 10-19, wherein:
the energy generator includes a piezoelectric element configured to convert a mechanical force on the piezoelectric element to an electrical output.

The foregoing description, for purpose of explanation, has been described with reference to specific embodiments. However, the illustrative discussions above are not intended to be exhaustive or to limit the scope of claims to the precise forms disclosed. Many modifications and variations are possible in view of the above teachings. The embodiments were chosen and described in order to best explain the principles of the various described embodiments and their practical applications, to thereby enable others skilled in the art to best utilize the principles and the various described embodiments with various modifications as are suited to the particular use contemplated.

What is claimed is:

1. A method, comprising:
while an energy harvesting device is in a cold start state, converting an electrical output provided by the energy harvesting device using a first voltage converter; and
in accordance with the energy harvesting device transitioning from the cold start state to a steady state, activating, with a microprocessor, a second voltage converter for synchronously converting the electrical output provided by the energy harvesting device.

2. The method of claim 1, wherein the energy harvesting device is determined to have transitioned from the cold start state when an electrical output from the first voltage converter is above a predefined threshold.

3. The method of claim 1, wherein the energy harvesting device is determined to have transitioned from the cold start state based on signals from one or more sensors coupled with the microprocessor.

4. The method of claim 1, including:
deactivating, with the microprocessor, the first voltage converter in connection with activating the second voltage converter.

5. The method of claim 1, including:
prior to activating the second voltage converter, providing an electrical output of the first voltage converter to power the microprocessor.

6. The method of claim 1, further comprising:
subsequent to activating the second voltage converter, switching, using the microprocessor, from the second voltage converter to the first voltage converter for converting the electrical output provided by the energy harvesting device.

7. The method of claim 1, further comprising:
subsequent to activating the second voltage converter, switching, using the microprocessor, between the first voltage converter and the second voltage converter for converting the electrical output provided by the energy harvesting device.

8. The method of claim 1, wherein:
the second voltage converter receives the electrical output provided by the energy harvesting device via an energy storage device.

9. The method of claim 8, wherein:
the first voltage converter receives the electrical output provided by the energy harvesting device without going through the energy storage device.

10. An electrical device, comprising:
an energy harvesting device;
a first voltage converter electrically coupled to the energy harvesting device;
a second voltage converter electrically coupled to the energy harvesting device, the second voltage converter being distinct and separate from the first voltage converter; and
a microprocessor coupled with the first voltage converter and the second voltage converter and configured to:
activate the first voltage converter to convert an electrical output of the energy harvesting device while the energy harvesting device is in a cold start state; and
activate the second voltage converter to synchronously convert the electrical output provided by the energy harvesting device while the energy harvesting device is in a steady state.

11. The electrical device of claim 10, further comprising:
an energy storage device electrically coupled to the energy harvesting device to receive the electrical output provided by the energy harvesting device.

12. The electrical device of claim 11, wherein:
the second voltage converter is electrically coupled to an output of the energy storage device to receive the electrical output of the energy harvesting device via the energy storage device.

13. The electrical device of claim 12, wherein:
the first voltage converter does not receive the electrical output of the energy storage device.

14. The electrical device of claim 11, wherein:
the energy storage device comprises a transformer.

15. The electrical device of claim 11, further comprising:
a switch electrically coupled to the energy storage device and electrically coupled to the microprocessor, wherein the microprocessor is further configured to selectively open and close the switch to direct electrical output of the energy storage device.

16. The electrical device of claim 10, wherein:
the first voltage converter comprises a first direct current to direct current (DC-DC) converter; and
the second voltage converter comprises a second DC-DC converter.

17. The electrical device of claim 10, wherein:
the microprocessor is further configured to determine whether the energy harvesting device is in the cold start state or the steady state based at least in part on the electrical output of the energy harvesting device.

18. The electrical device of claim 10, further comprising:
one or more sensors electrically coupled to the microprocessor;
wherein the microprocessor is further configured to determine whether the energy harvesting device is in the cold start state or the steady state based at least in part on signals from the one or more sensors.

19. The electrical device of claim 10, wherein:
the energy harvesting device includes a piezoelectric element configured to convert a mechanical force on the piezoelectric element to an electrical signal.

* * * * *